United States Patent [19]

Halsall et al.

[11] 4,444,853
[45] Apr. 24, 1984

[54] STORAGE BATTERY CONSTRUCTION

[75] Inventors: Vincent M. Halsall, River Hills; Roy E. Hennen, Mequon, both of Wis.

[73] Assignee: Globe-Union Inc., Milwaukee, Wis.

[21] Appl. No.: 510,175

[22] Filed: Jul. 1, 1983

[51] Int. Cl.³ .............................................. H01M 2/12
[52] U.S. Cl. ........................................ 429/54; 429/87; 429/177; 429/178
[58] Field of Search ....................... 429/54, 82, 87, 88, 429/177, 178–184, 160

[56] References Cited

U.S. PATENT DOCUMENTS

| | | | |
|---|---|---|---|
| 3,689,322 | 9/1972 | Lindenberg et al. | 429/178 X |
| 4,117,203 | 9/1978 | Sjogren | 429/178 X |
| 4,121,017 | 10/1978 | Dougherty et al. | 429/177 X |
| 4,371,591 | 2/1983 | Oxenreider et al. | 429/88 |

Primary Examiner—Charles F. LeFevour

Attorney, Agent, or Firm—John Phillip Ryan; Joseph J. Jochman, Jr.; Larry L. Shupe

[57] ABSTRACT

A storage battery, particularly adapted for automotive applications, includes unique cover, venting and terminal constructions which, in their various embodiments, can accommodate virtually any automobile cable arrangement. Each of the several embodiments utilizes an identical container, electrode construction, intercell assembly and venting arrangement. Various types of exterior battery terminals, accommodating both conventional pressure clamps and threaded connectors, are connected to the battery electrodes through an intermediate primary cover. An outer secondary cover encloses the entire top of the battery, except for direct access to the exterior terminals, and the venting assembly is totally enclosed between the primary and secondary covers.

17 Claims, 12 Drawing Figures

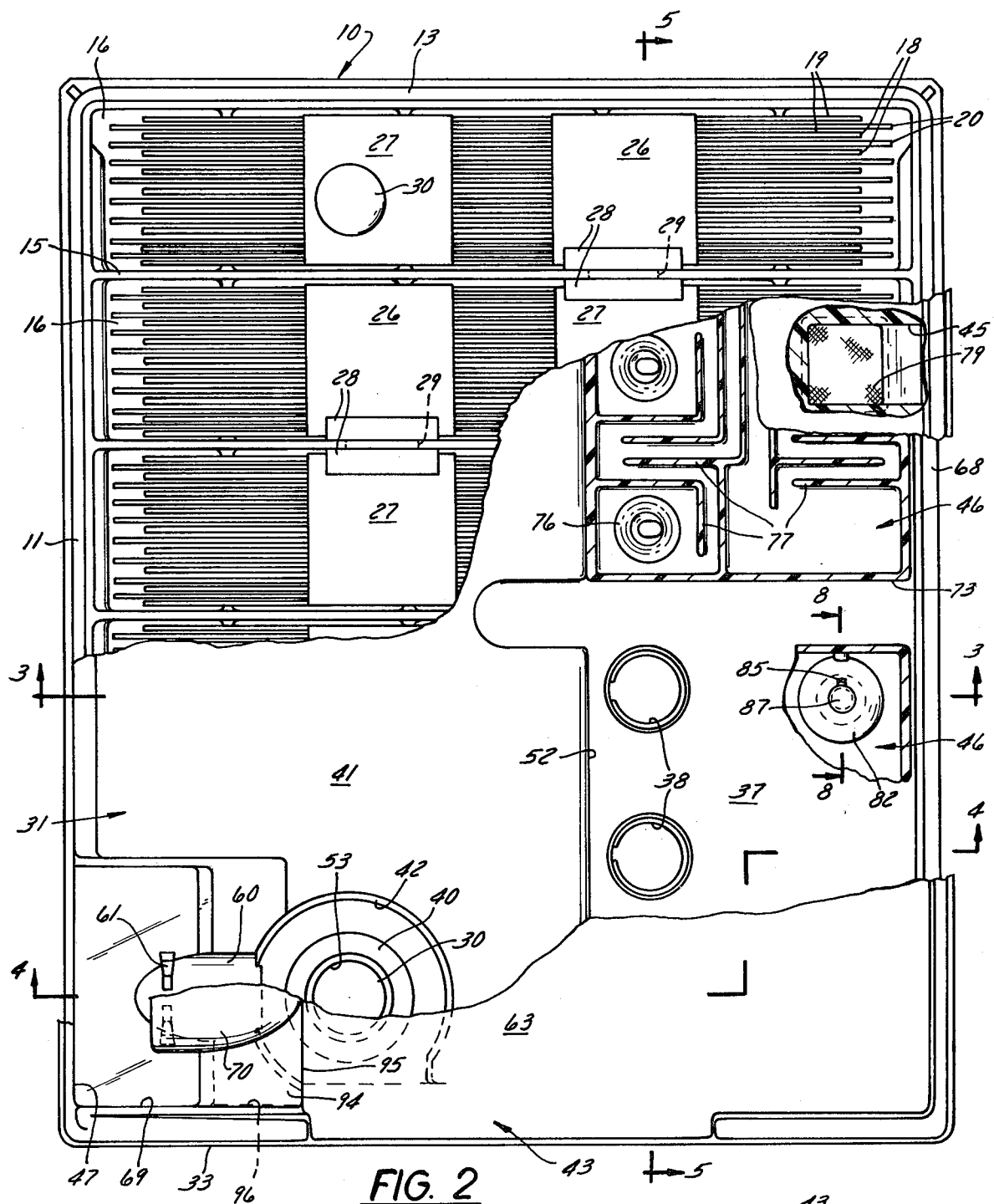
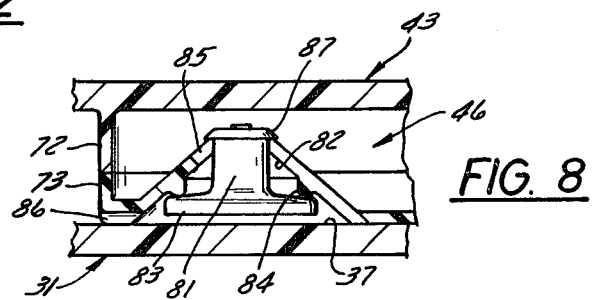

STORAGE BATTERY CONSTRUCTION

BACKGROUND OF THE INVENTION

The present invention pertains to electric storage batteries and, in particular to lead-acid batteries used for starting, lighting and ignition (SLI) of automotive vehicles.

SLI batteries are almost exclusively of the well-known lead-acid type and, although the basic electrochemical construction and operation of all SLI batteries is virtually identical, the combinations of container shapes and sizes, and types and locations of the exterior battery terminals are as numerous as the different types of vehicles in which they are used. Each major automobile manufacturer applies its own criteria in battery size and design, as well as performance, and these criteria are continually subject to change, because of continuing changes both in battery technology and in automotive design. The result is a large proliferation in automobile battery types, the effects of which are particularly burdensome to the manufacturers and suppliers of batteries to the automotive replacement market.

In the United States, battery manufacturers and suppliers have attempted to identify and categorize automotive batteries, primarily by group size, but also on the basis of battery container shape, terminal construction and location, and performance rating. Battery Council International, an association of manufacturers and suppliers, presently categorizes 12-volt passenger car and light commercial batteries in 44 different group sizes, all of which are dimensionally different. Combined with the other variables in terminal location and construction and battery performance, the battery supplier faces potentially staggering manufacturing and inventory problems There presently exists, therefore, a real need for an automotive battery, particularly suited to the replacement market, which will meet the widest range of group size, terminal configuration and performance requirements. Such a battery should also be readily suitable for direct replacement or simple conversion for easy replacement. It is also desirable that such a battery be designed to utilize to the greatest extent possible existing conventional manufacturing processes and equipment. Finally, because of the well-recognized potential hazards associated with the use and operation of lead-acid batteries, there must be no diminution in the techniques and methods available to enhance the safe venting of cell gases and to prevent corrosion by the acid electrolyte.

SUMMARY OF THE INVENTION

The storage battery of the present invention, in its several embodiments, utilizes an identical single size container and an identical major portion of the entire battery construction and assembly. Each embodiment comprises a unique external terminal construction which, in combination with the minimization in size of the standard container, lends itself to a broad range of battery group sizes for direct replacement applications. The specific terminal construction of each embodiment is either of the standard cylindrical post construction adapted to be attached to the automobile battery cables by means of a conventional pressure clamp or of the threaded type typical of conventional side terminal batteries to which the battery cables are connected with a bolt.

A battery of the present invention utilizing one type of conventional terminal attachment and including provision for simple conversion of the automobile battery cables adapted for use with the other type of conventional terminal attachment will provide direct replacement for batteries classed in well over half of the existing BCI group size categories, which categories cover approximately 85%–90% of all 12-volt automotive batteries in use today. Alternately, if two batteries selected from the various disclosed embodiments of the present invention are utilized, one comprising post terminals and the other threaded terminals, the same broad replacement coverage may be provided without the need to include provision for the conversion of the automobile battery cable terminations.

Each emobidment of the invention utilizes an identical container, electrode construction and assembly, and venting assembly. Each embodiment further utilizes a substantially identical two-piece cover assembly, including an inner primary cover into which the exterior battery terminals are completely or partially molded and an outer secondary cover which completely encloses the primary cover and intermediate venting assembly, except for direct access to the exterior battery terminals. For each of the embodiments, attachment of the primary cover to the container and electrode assembly is virtually identical, as is attachment of the secondary cover to complete the battery construction.

The venting assembly, which is identical to all embodiments, is completely enclosed within the assembled battery and the external vents are disposed at points remote from the battery terminals. The venting assembly further includes unique secondary or by-pass venting means which continues to provide effective venting in case of clogging or other inoperability of the filter or primary vents.

Although two of the embodiments of the invention include exterior terminal assemblies adapted for direct replacement connection in automobiles utilizing conventional side terminal cables, the terminals are located in or extend from the inner primary cover. Thus, the problems of assembly, sealing and corrosion of conventional side terminals located in the container walls are entirely obviated.

BRIEF DESCRIPTION OF THE DRAWINGS

FIG. 2 is a top plan view of the battery shown in FIG. 1 with portions of the primary and secondary covers broken away.

FIG. 8 is a partial sectional view taken on line 8—8 of FIG. 2.

DETAILED DESCRIPTION OF THE PREFERRED EMBODIMENTS

Figure 1:
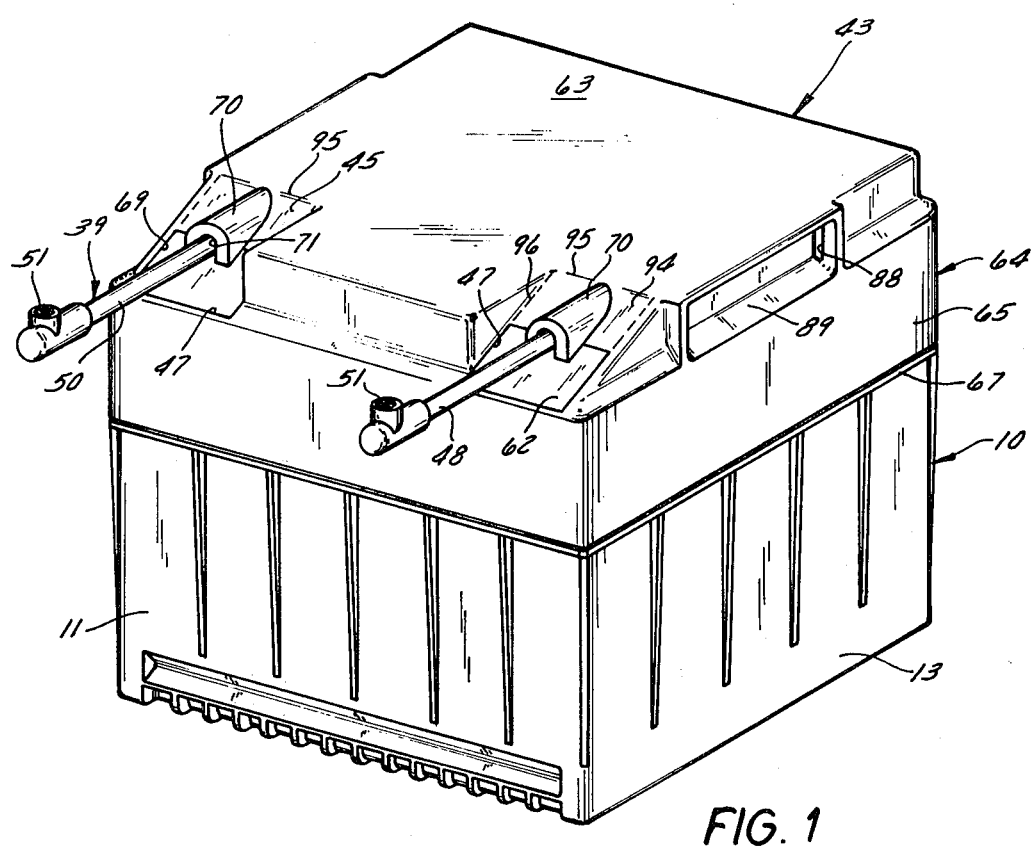
FIG. 1 is a perspective view of the first preferred embodiment of the battery of the present invention.
Figure 3:
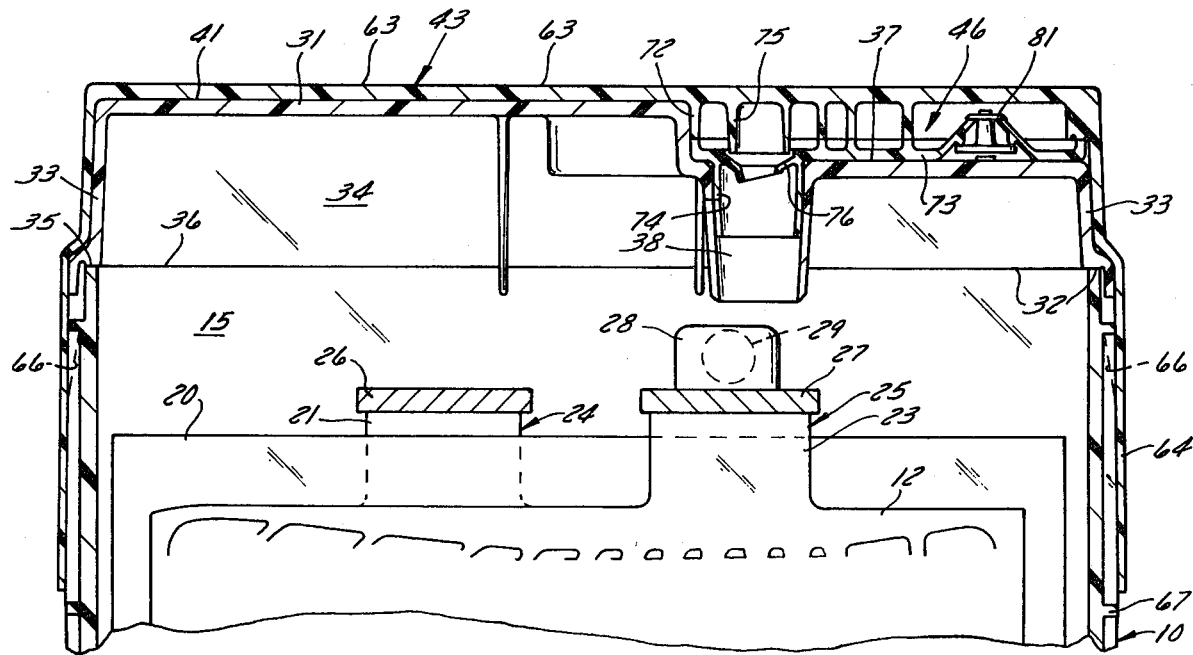
FIG. 3 is a partial sectional view taken on line 3—3 of FIG. 2.

FIGS. 1 through 7 show the details of a storage battery incorporating the construction of the first preferred embodiment of the cover, venting and terminal assembly comprising the subject matter of this invention. The battery includes a generally rectangular container 10 made of an injection molded thermoplastic, preferrably polypropylene. The container 10 includes a pair of opposite side walls 11, an interconnecting pair of end walls 13 and a bottom 14. The interior of the container is divided into a series of cells 16 by a plurality of parallel partition walls 15 extending, in the embodiment shown, between the side walls 11 and to the bottom 14. Within each cell 16, there is disposed an electrode stack comprising alternate positive and negative plates 18 and 19 with a separator 20 between each adjacent plate pair. The positive and negative plates are of substantially standard construction with each including a supporting conductive grid 12 holding therein a conventional active material 22. The positive and negative plate grids include lugs 21 and 23 extending upwardly and offset laterally from the midpoints of their upper edges. For the electrode stack in each cell 16, the positive lugs 21 and the negative lugs 23 are grouped in two spaced parallel rows 24 and 25, respectively. The electrode stacks in adjacent cells are disposed in opposite orientation such that each row of lugs along the entire length of the container 10 includes alternate cell groups of positive and negative lugs. The lugs 21 or 23 of each cell group of common polarity are interconnected at their free upper edges by a conductive strap 26 or 27, respectively. The electrode stacks in the cells are electrically connected in series by intercell connections, each comprising a vertically disposed connector lug 28 attached to and extending upwardly from a conductive strap 26 or 27 adjacent a partition wall 15 and a conductor button 29 extending through the partition wall and welded to another connector lug 28 in the adjacent cell. Both conductive straps 26 and 27 of each intermediate cell group have one such intercell connection, but only one conductive strap in each end cell includes an intercell connection. The other conductive strap in each of the two end cells is provided with an integral cylindrical upwardly extending intermediate terminal post 30. The terminal posts 30 in the end cells are of opposite polarity.

The container, electrode stack and intercell connection construction thus far described is essentially standard and common to each of the specific embodiments of the improved cover, venting and terminal assemblies to be hereinafter described.

With continued reference to FIGS. 2 through 6, a primary container cover 31 is adapted to overlie and be attached to the container 10. The primary cover 31 includes downwardly depending peripheral edge portions 33 corresponding to the upper edges 35 of the container walls 11 and 13, and intermediate ribs 34 corresponding to the upper edges 36 of the partition walls 15. The edge portions 33 and intermediate ribs 34 define a continuous coplanar sealing surface 32 adapted to abut and be uninterruptably sealed to the upper edges 35 and 36 of the container walls and partition walls.

The primary cover 31 also includes a substantially planar first top surface portion 37 which lies adjacent the container side wall 11 farthest from the intermediate terminal posts 30. A series of substantially cylindrical sleeves 38 depend downwardly from the underside of the first top surface portion with each sleeve 38 adapted to overlie and provide access to a cell 16 for filling same with electrolyte. The sleeves also provide for the egress from the cells of gases generated in the electrochemical reactions, the complete venting of which will be described in further detail below.

Extending from the intermediate edge of the first top surface portion 37 is a raised second top surface portion 41. In the opposite corners of the second top surface portion 41, lying generally above the intermediate terminal posts 30, are a pair of recesses 42. A terminal bushing 40 is molded into the lower surface of each recess 42, as by insert molding in the process of injection molding of the cover 31. Each terminal bushing includes a hollow generally cylindrical body portion 53 which, as the primary cover 31 is placed over and attached to the container, is adapted to receive therein the upper end of an intermediate terminal post 30 (as shown in dashed outline in FIG. 4).

Figure 7:
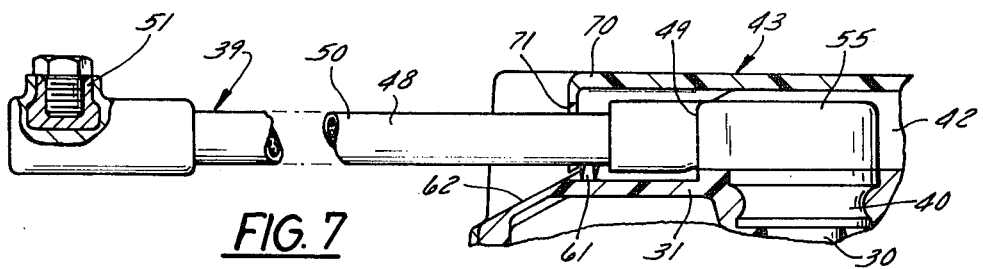
FIG. 7 is an enlarged view of a portion of FIG. 4 showing the exterior battery terminal and its attachment to the battery.
Figure 4:
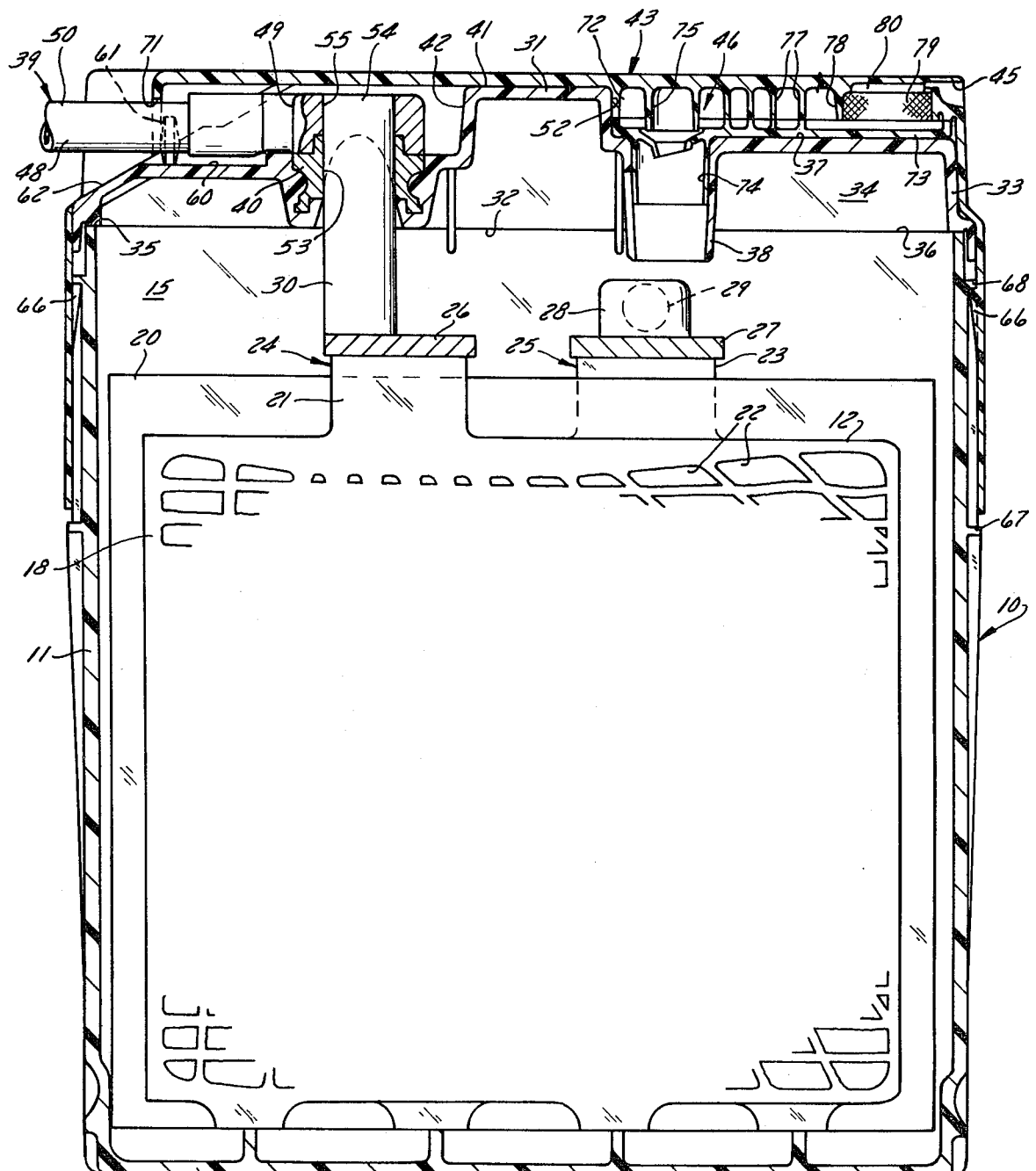
FIG. 4 is a full sectional view taken on line 4—4 of FIG. 2.
Figure 5:
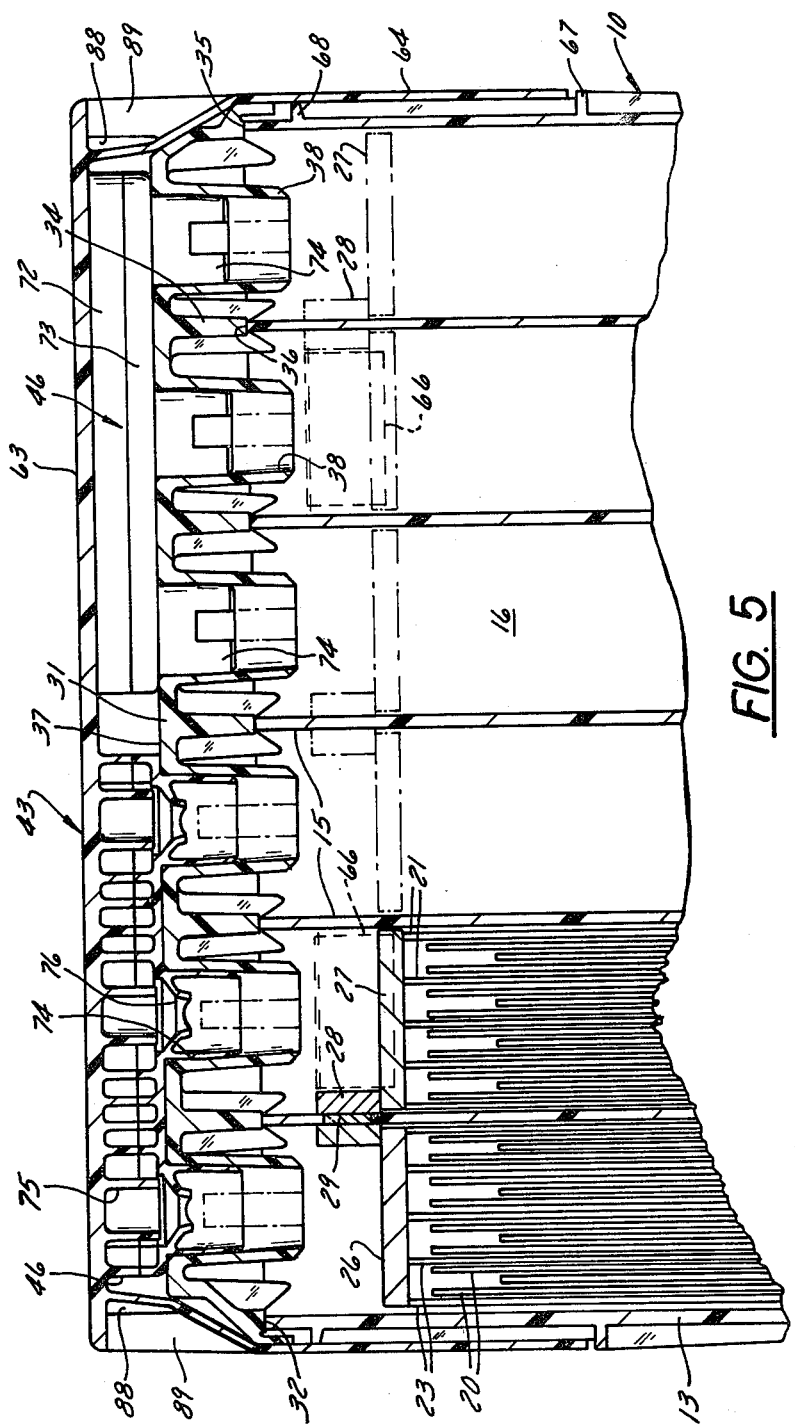
FIG. 5 is a partial sectional view taken on line 5—5 of FIG. 2.

As is best shown in FIGS. 4 and 7, a pair of exterior battery terminals 39 are each attached at one end to an intermediate terminal post 30 and terminal bushing 40 and extend laterally offset from a line defined by the two intermediate terminal posts 30. Each exterior battery terminal 39 comprises a short cable connector 48 having an inner end 49 fused to one intermediate terminal post and bushing, an intermediate cable section 50 extending outwardly of the battery, and an outer threaded terminal connecter 51 for attachment to a conventional side terminal battery cable in a vehicle.

To facilitate connection of the cable connectors 48 to the intermediate terminal posts 30, each terminal post is preferably provided with an axially aligned post extension 54 which is cast from molten lead and fused together to the terminal post and terminal bushing 40. The inner end 49 of the cable connector 48 comprises a ring end 55 which is adapted to be placed over and to encircle the post extension 54 and to be fused thereto and, preferably, also to the top of the terminal bushing 40.

Each intermediate cable section 50 of a cable connector 48 extends outwardly from the recess 42 in the primary cover 31 through a semi-cylindrical channel 60 contiguous with the recess 42. A pair of holding tabs 61 near the outer end of each semi-cylindrical channel 60 is adapted to cradle and grip the outer surface of the intermediate cable section 50 in a manner which will be more fully described hereinafter. Adjacent the outer end of each semi-cylindrical channel 60 is a downwardly sloping surface 62 which intersects the edge of the primary cover 31 at the downwardly depending peripheral edge portion 33.

The construction of the battery is completed with an outer secondary cover 43 which overlies the primary cover 31 and extends downwardly over and is attached to the upper portion of the container 10. The outer cover 43 includes a substantially planar upper surface 63 and an integral downwardly depending shroud 64. The shroud 64 includes wall portions 64 which lie just outside and closely adjacent the upper portions of the container side walls 11 and end walls 13. The wall portions 65 terminate with their lower edges disposed just above an intermediate peripheral rib 67 extending outwardly from the container walls 11 and 13. A pair of locking tabs 66 is integrally attached to the inner surface of each of a pair of oppositely disposed wall portions 65 of the shroud 64 and, as the outer cover 43 is placed over the inner cover 31 and container 10, the locking tabs 66 engage an upper peripheral rib 68 near the upper edge of the container 10 and lock the outer cover thereto.

In adjacent corners of the outer cover are a pair of terminal openings 47 through which the intermediate cable sections 50 and attached terminal connectors 51 are fed as the outer cover 43 is placed over the primary cover 31 and container 10. Each terminal opening 47 is defined by a lower generally rectangular portion 69, the upper edge of which is interrupted by a semi-cylindrical hood 70. Extending laterally from each side of the hood 70, and defining the remainder of the upper edge of each rectangular portion 69 of the terminal openings 47, are inclined surfaces 94 which intersect the planar upper surface 63 along a line 95. The semi-cylindrical hood has a U-shaped edge 71 which, as the outer cover 43 is locked to the container 10, is adapted to cooperate with the holding tabs 61 in the semi-cylindrical channel 60 of the primary cover 31 to firmly engage the outer surface of the intermediate cable section 50 of the cable connector 48. Further, when the outer cover 43 is in its final locked position, the downwardly sloping surfaces 62 in the adjacent corners of the primary cover 31 project into and substantially fill the respective rectangular portions 69 of the terminal openings 47 and lie essentially coplanar with the adjacent inclined surfaces 94 in the outer cover. Thus, in the fully assembled battery, the terminal openings 47 in the outer cover are essentially fully closed.

In order to provide access to the inner ends 49 of the cable connectors 48 after the outer cover has been attached (as for electrical testing or jump starting), the extreme opposite edges of each pair of inclined surfaces 94 may be slit, as along the dashed lines 96, from the upper edge of the rectangular portion 69 of the terminal opening 47 to the intersection line 95. The surfaces 94 and integral intermediate hood 70 may then be lifted for access, with the intersection line 95 acting as a living hinge. Upon closing, the U-shaped edge 71 in the hood 70 will re-engage the cable section 50 and close the terminal opening.

The gases generated within each cell 16 during the cyclic electrochemical reactions resulting from charging and discharging of the battery pass upwardly and out of each cell through the cylindrical sleeves 38 in the lower first top surface portion 37 of the primary cover 31. The exiting gases from the sleeves 38 enter a vent chamber 46 in the underside of the outer cover 43 and eventually exit to the outside of the battery through one of a pair of vents 45 located in the outer cover 43 above the rear side wall 11. A separate vent chamber 46 is provided for each vent 45 and each chamber is adapted to accomodate three cells 16 in the battery. Further, each vent chamber 46 comprises an upper half 72 and a lower half 73, the former molded as an integral part of the outer cover 43 and the latter molded separately and heat sealed or otherwise secured to the upper half before the outer cover is attached to the battery container 10. It is also possible to utilize conventional single or ganged vent plugs of a type well known in the art which would be separately inserted in the vent sleeves 38 prior to attachment of the outer cover 43. The outer cover, in this variation of the preferred embodiment, would have no portion of the vent chamber included as an integrally molded part thereof, but would simply overlie the conventional vent plugs. The vent plugs, in turn, would be adapted to provide appropriate venting communication to the vents 45 in the outer cover.

In its preferred embodiment, the lower half 73 of each vent chamber 46 includes a series of downwardly depending vent sleeves 74. As the outer cover 43 is brought down over the container for attachment thereto, the vent sleeves 74 are inserted into the cylindrical sleeves 38 in the first top surface portion 37 of the primary cover 31 and held therein within a tight press fit. The vent sleeves 74 open into the vent chamber 46 and include at their upper openings frustoconical drain surfaces 76 which extend slightly downwardly into the vent sleeves. Within the upper half 72 of the vent chamber 46, are a series of blind cylindrical tubes 75, each of which is axially aligned with a vent sleeve 74 and drain surface 76 and extends downwardly toward and terminates closely spaced from the latter. Surrounding each of the cylindrical tubes 75 and drain surface 76 is a maze-like arrangement of baffle walls 77, portions of which are formed integrally with each of the upper and lower halves 72 and 73 of the vent chamber and heat sealed together therewith. In the completely assembled vent chamber 46, the baffle walls 77 define closed tortuous paths for the egress of cell gases up through the cylindrical sleeves 38, vent sleeves 74, and drain surfaces 76 to ultimately exit from the battery through vents 45. Within the upper half 72 of the vent chamber 46, adjacent each vent 45, is an open square-walled housing 78 within which is mounted a microporous filter and flame arrester 79. The filter housing is also surrounded by a maze-like arrangement of baffle walls 77. The filter and flame arrester is spaced slightly from the underside of the upper surface 63 of the outer cover 43 to define a vent space 80 to enable full effective use of the entire filter surface. In the event the battery is jarred or tilted, the cylindrical tubes 75 inhibit the splashing of electrolyte into the vent chamber, the maze of baffle walls 77 restricts the movement of any electrolyte which may escape from the cells away from the areas immediately adjacent the vent sleeve openings, and the drain surfaces 76 facilitate return of escaped electrolyte to the cells.

Electrolyte from the cells may also find its way into the vent chamber through the condensation of acid vapors entrained in the gases as they egress from the battery. Such condensate will also tend to form within the baffled walls 77 near the upper ends of the vent sleeves 74 where it can be readily returned by gravity to the cells via the drain surfaces 76.

Figure 6:
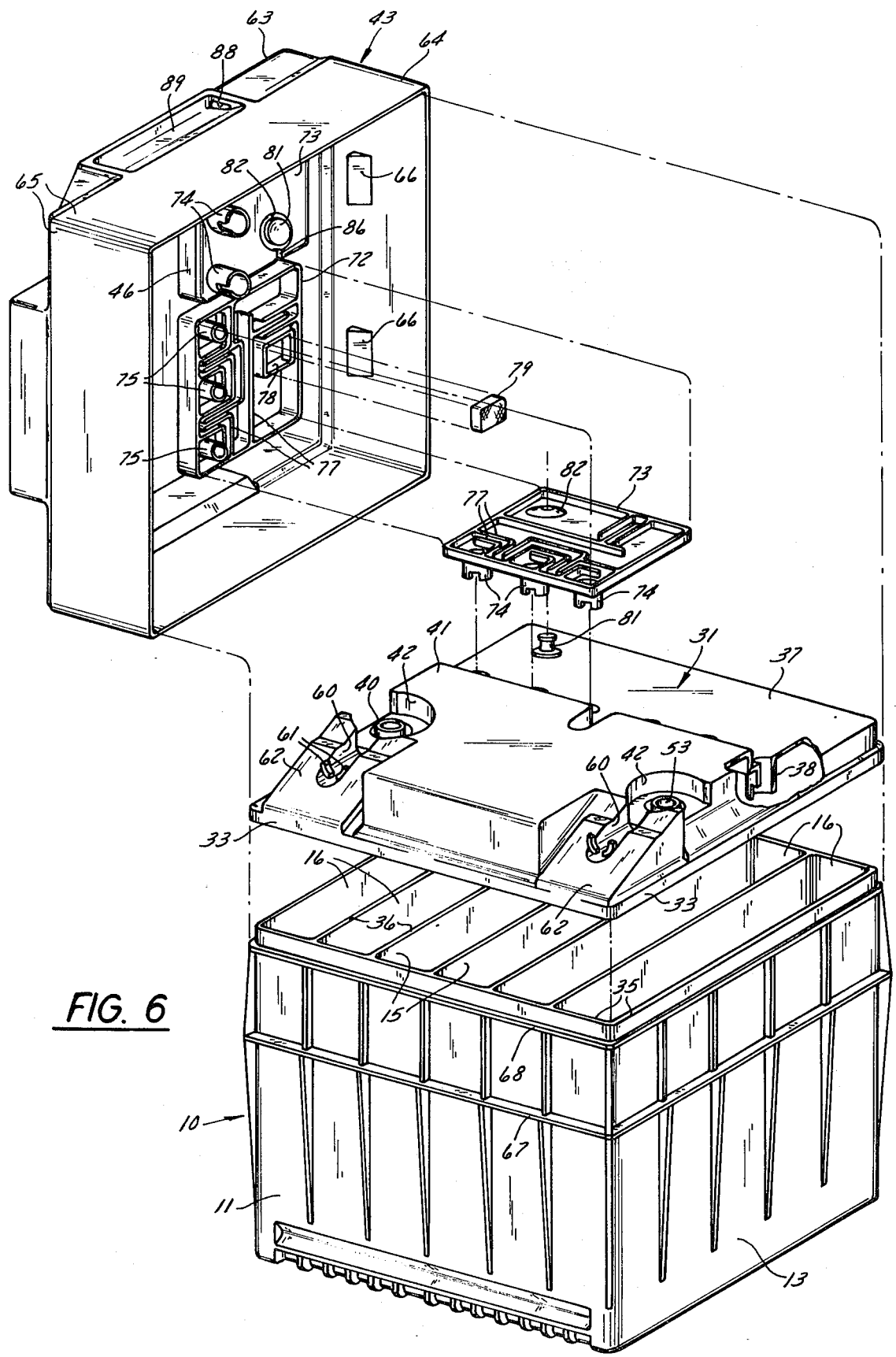
FIG. 6 is an exploded perspective view of the battery container, covers and venting assembly shown in FIG. 1 with the electrode and terminal elements removed.

The filter and flame arrestor 79 is of a well-known construction comprising, for example, microporous polypropylene. Despite attempts to isolate this filter material from contamination by acid vapors and other foreign matter either from inside or outside of the battery, the microporous media may in time become clogged and prevent the egress of cell gases. To prevent a potentially hazardous build-up of pressure within the vent chamber 46 and cells 16 resulting from a plugged filter 79, each vent chamber includes a pressureactuated relief valve 81. Each relief valve is of a flexible rubber or rubber-like construction and is mounted in an upwardly opening conical depression 82 in the underside of the lower half 73 of the vent chamber 46. The relief valve 81 is inserted from below into the conical depression 82 and held in place by an integral retaining flange 87 on its upper end. A lower sealing flange 83 on the valve bears against a circular seat 84 within the conical depression to normally seal the same against the egress of gases within the vent chamber 46. Should a pressure build-up occur in the vent chamber, the pressurized gas, via a small slot 85 in the upper opening in the conical depression 82, will deflect the lower flange 83 away from the seat 84 to relieve the pressure. With particular reference to FIGS. 6 and 8, because the vent chamber is adapted to rest tightly against the first top surface portion 37 of the primary cover 31, a vent slot 86 is formed in the bottom of the lower half 73 of the vent chamber extending from the edge thereof to the lower edge of the conical depression 82. Gases vented past the relief valve 81 may thus pass freely into the open spaces between the outer cover 43 and primary cover 31 where they will eventually escape from the battery, preferably through an outlet 88 located in the carrying recesses 89 in each end of the outer cover 43. Alternately, such vented gases may also be allowed to escape past the shroud 64 or through the terminal openings 47 in the outer cover.

Figure 9:
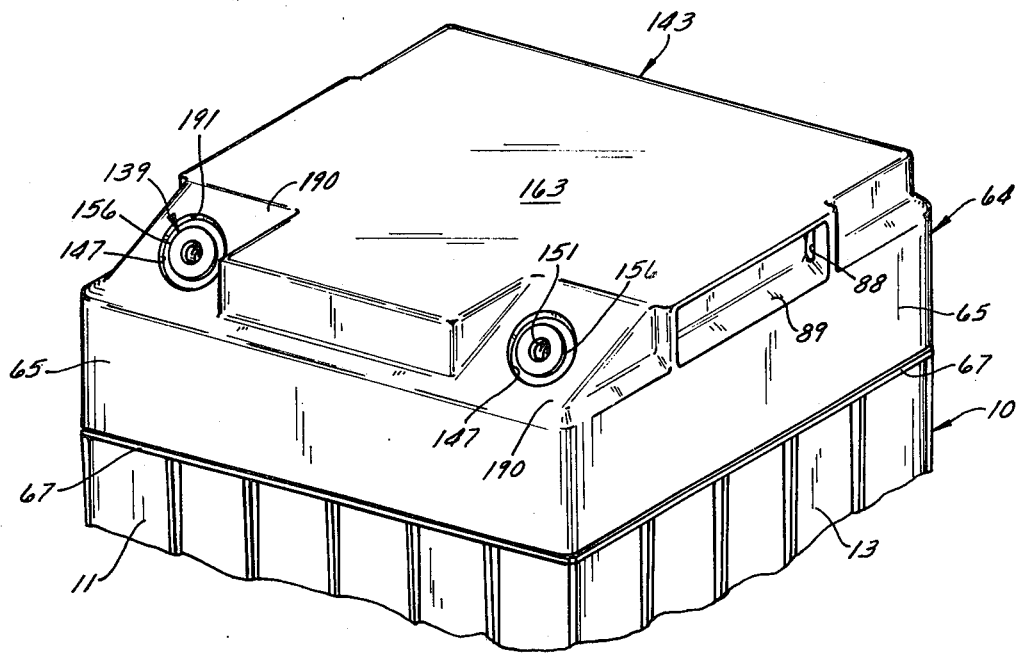
FIG. 9 is a partial perspective view of the second preferred embodiment of the battery of the present invention.
Figure 10:
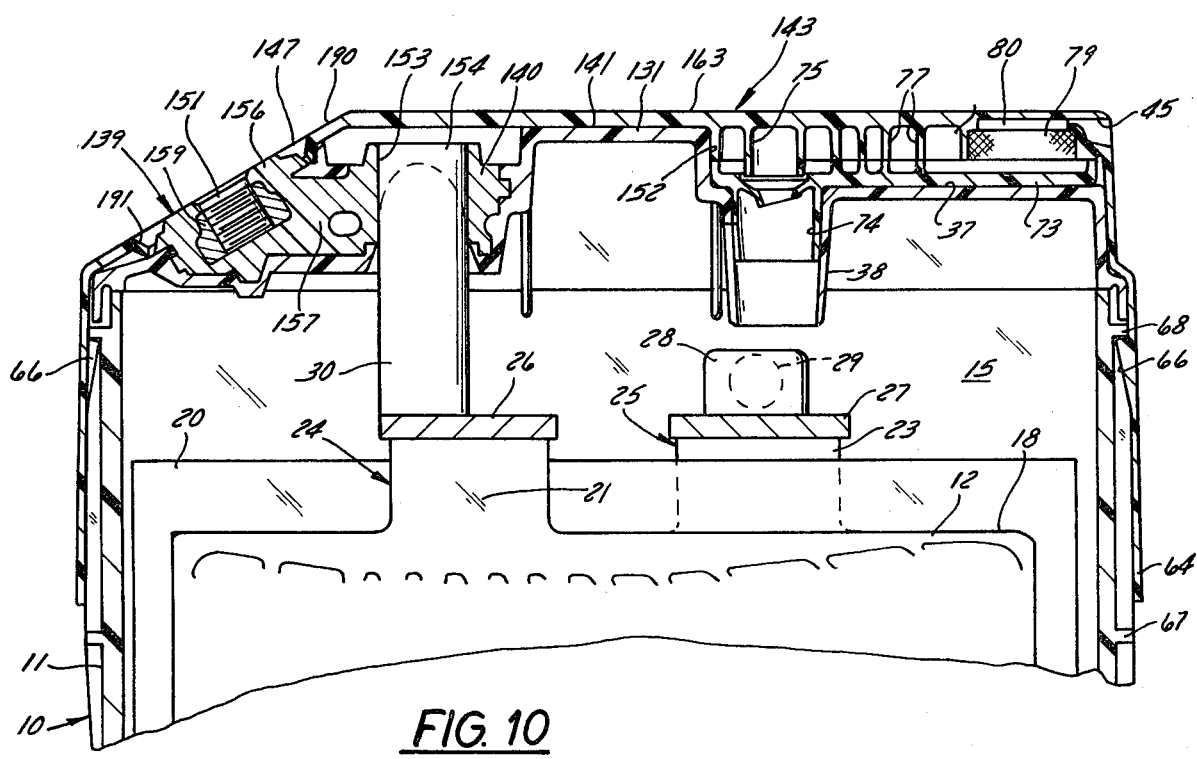
FIG. 10 is a partial sectional view similar to FIG. 4 showing the construction of the exterior battery terminal of the embodiment of FIG. 9.

FIGS. 9 and 10 show the second preferred embodiment of the invention. The construction of the container and the cell electrodes, including the intermediate terminal posts 30 is identical to the first preferred embodiment. Further, the construction and attachment of the primary cover 131 and the outer secondary cover 143 are also largely the same as their counterparts 31 and 43, respectively, in the first preferred embodiment. The venting assembly comprising the elements of both the primary and secondary covers is in all respects identical to the venting assembly of the first preferred embodiment, and these elements are, therefore, identified with identical reference numbers. Thus, the distinguishing feature of this embodiment is the exterior battery terminal 139.

The exterior battery terminal 139 is cast integrally with the terminal bushing 140 and insert molded as a unit into the second top surface portion 141 of the primary cover 131. The cylindrical body portion 153 of the terminal bushing 140 is adapted t receive therein the upper end of the intermediate terminal post 30 as a primary cover 131 is placed upon the container 10. An axially aligned terminal post extension 154 is cast from molten lead and fuses together the intermediate terminal post 30 and terminal bushing 140. The exterior battery terminal 139 is integrally attached to the terminal bushing 140 by an intermediate neck 157 and includes a terminal body portion 156 provided with a threaded terminal connector 151. The threaded terminal connector 151 preferably comprises a nut 159 cast into the terminal body portion 156 and which, like the first preferred embodiment is adapted to have attached thereto conventional side terminal battery cables. The terminal body portions 156 of each external battery terminal 139 are positioned near the forward edge of the container 10 and disposed on an incline such that the axes of the threaded terminal connectors 151 are disposed at an acute angle to the vertical container side wall 11.

The outer secondary cover 143 is in most respects identical to the outer cover 43 of the first preferred embodiment. It includes a planar upper surface 163 and an integral downwardly depending shroud 64 comprising side and end wall portions 65. Its placement over the primary cover 131 and attachment to the container 10 is as previously described for the first embodiment. A pair of terminal surface portions 190 are disposed in adjacent corners of the outer cover 143 and slope downwardly from the planar upper surface 163 to intersect the front side wall portion 65 of the shroud 64. Each terminal surface portion 190 includes a terminal opening 147 into which the face of the terminal body portion 156 of the exterior battery terminal 139 extends as the secondary cover is attached to the container. The terminal openings 147 each include a downwardly beveled flange 191 adapted to engage the periphery of the terminal body portion 156 such that in the assembled battery the terminal openings 147 are substantially closed. In the assembled battery, the terminal surface portions 190 are disposed in a plane perpendicular to the axis of the threaded terminal connector 151 and are coplanar with the faces of the terminal body portions 156.

Figure 11:
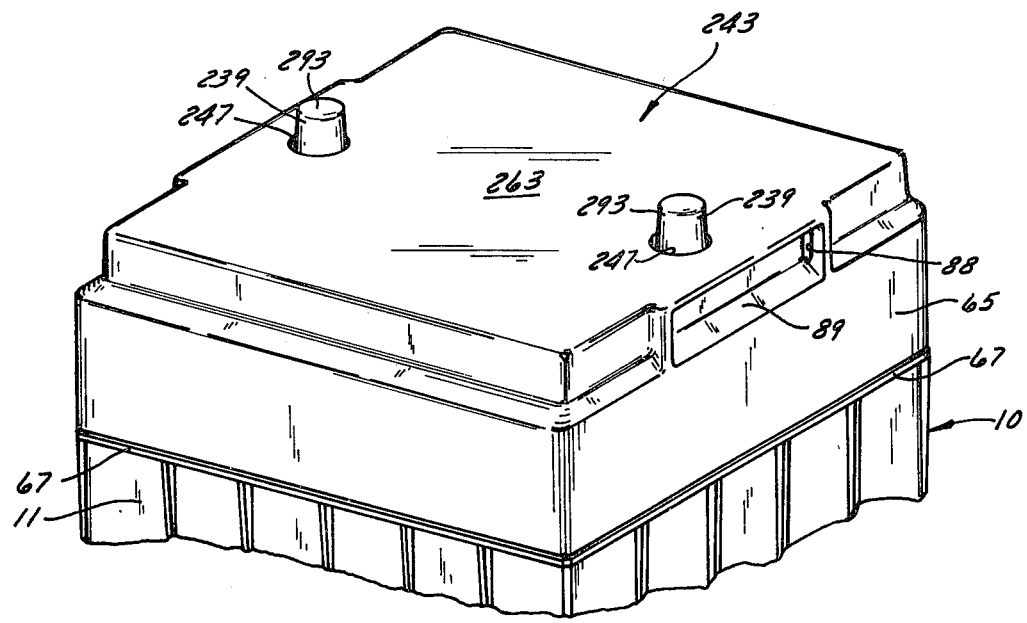
FIG. 11 is a partial perspective view of the third preferred embodiment of the battery of the present invention.
Figure 12:
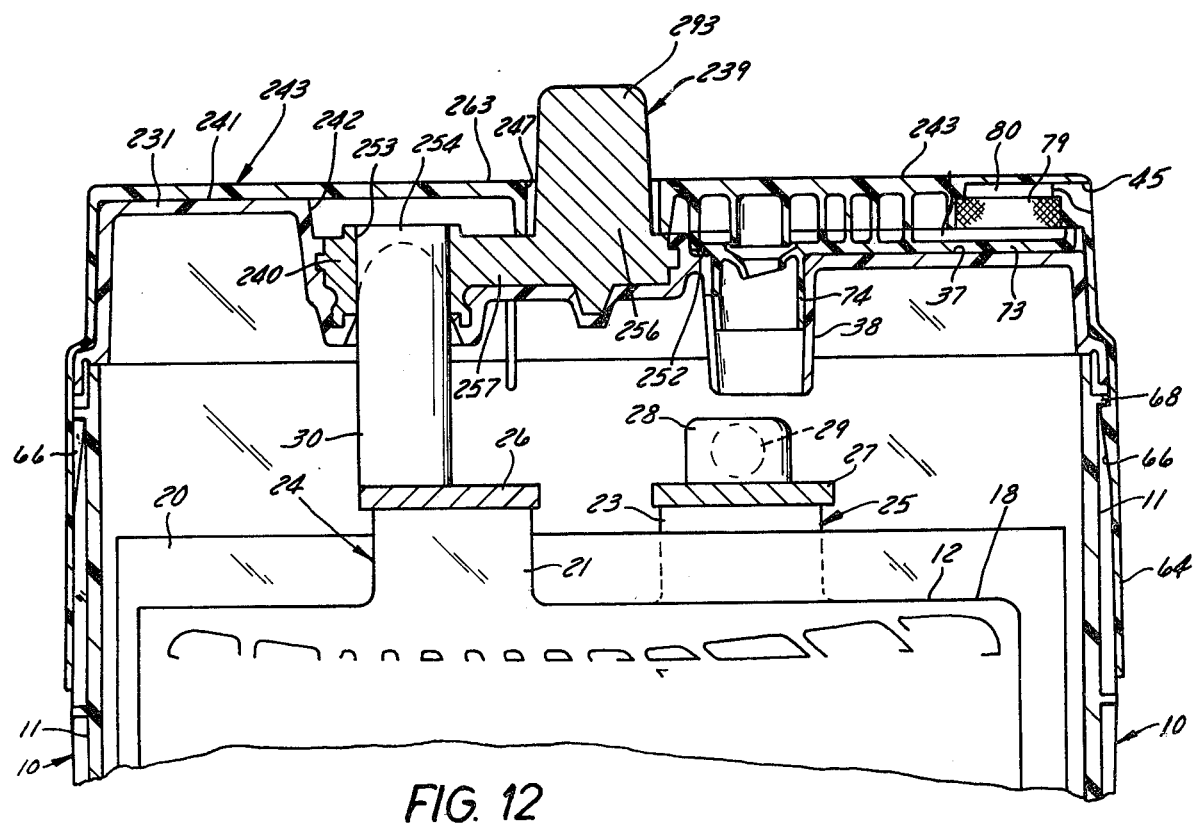
FIG. 12 is a partial sectional view similar to FIGS. 4 and 10 showing the construction of the exterior battery terminal of the embodiment of FIG. 11.

The third embodiment of the invention, shown in FIGS. 11 and 12, includes a container, electrode element and venting assembly identical to the first and second embodiments. The exterior battery terminal 239 is, however, of a different construction and the primary cover 231 and secondary cover 243 likewise include modified elements to accomodate the construction of the exterior battery terminal unique to this embodiment.

As in the case of the second embodiment, the exterior battery terminal 239 of this embodiment is formed integrally with the terminal bushing 240 and the unitary construction is molded into the primary cover 231. The second top surface portion 241 of the primary cover 231 includes a pair of recesses 242 into each of which is molded an integral exterior battery terminal 239 and terminal bushing 240. The terminal bushing 240, like the previous two embodiments, includes a cylindrical body portion 253 for receipt of the uppper end of the intermediate terminal post 30, the interconnection between the two being formed by a cast post extension 254 after the primary cover has been attached to the battery container 10. The exterior battery terminal 239 is attached to the terminal bushing by a neck 257 and includes a terminal body portion 256 having an upwardly extending terminal post 293 adapted to accept automobile battery cables having conventional pressure clamp connectors. The exterior battery terminals 239 are offset laterally from the line defined by the intermediate terminal posts 30 but, as compared to the exterior battery terminals 39 and 139 of the first two embodiments which are offset toward the front side wall 11 of the container, the exterior battery terminals 239 are offset to a position on the longitudinal centerline of the top of the battery.

The outer secondary cover 243 includes a planar upper surface 263 having formed therein a pair of terminal openings 247 adapted to receive the upper ends of the terminal posts 293 as the secondary cover is placed over the primary cover and attached to the container. Except for the location and configuration of the terminal openings 247, the secondary cover 243 is in all respects identical to the constructions of the outer covers 43 and 143, respectively, of the first and second embodiments.

As mentioned previously, the cell access, vent chamber and vent constructions of the primary and secondary covers in all three embodiments of the invention are identical. Conversely, the exterior battery terminals, their attachment to the primary covers, and the terminal openings in the secondary covers vary among the three embodiments. Thus, in the formation of the covers from thermoplastic materials by injection molding, a single primary mold may be utilized for each of the two basic covers, each of which would include all of the elements common to each cover. The elements which vary among the three different embodiments may then be produced by interchangeable mold parts selectively inserted into the primary molds. For example, and with particular reference to FIGS. 4, 10 and 12, for the injection molding of the three primary covers 31, 131 and 231, all elements common to each of the three embodiments lie to the right of the vertical walls 52, 152 and 252, defining the transition between the common first top surface portion 37 and the varying second top surface portions 41, 141 and 241. These latter portions of the primary covers for the three different embodiments, including the insert-molded exterior battery terminals 39, 139 and 239, would be selectively molded by the use of interchangeable mold parts in conjunction with the common primary mold portions. Each of the three outer secondary covers 43, 143 and 243 may be similarly injection molded with a single mold having common element portions and varying interchangeable portions.

The initial charging or formation of each of the described embodiments of the invention is preferably done before attachment of the outer secondary covers. In the battery of the third embodiment, shown in FIGS. 11 and 12, the formation current is applied through cables attached directly to the terminal posts 293 after attachment of the outer cover. In the batteries of the first and second embodiments, however, the terminal post extensions 54 and 154, as shown respectively in FIGS. 4 and 10, are initially formed to longer lengths, used as intermediate attachments for the formation cables and subsequently cut or burned off to their proper lengths. In the case of the first embodiment, the battery is formed before attachment of the exterior battery terminal 39 and, in the case of the second embodiment, the battery is formed after attachment of the exterior terminal 139. In both cases, intermediate vent plugs (not shown) are inserted in the cylindrical sleeves 38 in the primary cover 31 and 131 during formation. The intermediate vent plugs are removed after formation and the secondary covers 43 and 143 are attached as hereinbefore described.

Referring to FIGS. 1 and 9, the exterior battery terminals 39 and 139 of the first and second embodiments, respectively, are adapted for direct use in automotive applications for automobiles having cables equipped with standard side terminal lugs. In such an application, the terminal lugs on the automobile cables are attached to the threaded terminal connectors 51 or 151 with a bolt, such as the type shown in FIG. 7. It is also possible, of course, to modify automobile battery cables equipped with the older conventional top terminal pressure clamps with side terminal adapters which would allow connection to terminals of the first or second embodiment. The battery construction of the third embodiment shown in FIG. 11, on the other hand, incorporates the conventional top terminal posts 293 to which automotive battery cables with conventional pressure-type clamps may be directly attached.

In a further variation, the exterior battery terminals 139 of the second embodiment of FIGS. 9 and 10 may be provided with the conventional top terminal posts 293 of the third embodiment (FIGS. 11 and 12) instead of the threaded terminal connector 151 shown. In this modified embodiment, the terminal posts would be disposed at a similar acute angle to the vertical container side wall as are the axes of the threaded terminal connectors 151 of the previously described preferred construction of the second embodiment.

Because the outer secondary covers 43, 143, or 243 are mechanically locked to the container, as opposed to the heat sealed bond by which the primary covers are attached, it is possible to use a different material for the secondary cover than polypropylene. For example, certain polyethylene compounds are not as brittle as polypropylene and thus not as susceptible to shattering, particularly at lower temperatures.

We claim:

1. In a storage battery having a generally rectangular thermoplastic container defined by a pair of opposite side walls, a pair of opposite end walls and a bottom, a series of parallel partition walls extending between the side or end walls and dividing the container into a series of cells, an electrode stack within each cell including alternately disposed positive and negative plates with a separator between each adjacent pair of plates, the positive and negative plates having lugs extending upwardly and offset laterally from the midpoints of their upper edges with the positive and negative lugs disposed in two spaced parallel rows, the electrode stacks in adjacent cells disposed in opposite orientation such that each row of lugs includes alternate cell groups of positive and negative lugs, the lugs of each cell group of common polarity interconnected by a conductive strap, one conductive strap of each end cell group and both conductive straps of each intermediate cell group having a conductive intercell connection through a partition wall to the conductive strap of the adjacent cell group of opposite polarity, and the other conductive straps of the cell groups in each of the two end cells of the container being provided with integral upwardly extending intermediate terminal posts of opposite polarity; an improved cover, venting and terminal assembly comprising:
    (a) a primary container cover including downwardly depending edge portions and intermediate ribs adapted to overlie the upper edges of the container walls and partition walls, respectively, and to be attached and uninterruptably sealed thereto;
    (b) the primary cover including a substantially planar top surface portion adjacent the container wall opposite the intermediate terminal posts;
    (c) a series of integral sleeves extending downwardly from the underside of the planar top surface portion, each sleeve adapted to provide access to a cell for filling the same with electrolyte and for allowing the egress of gases from the cell;
    (d) a pair of exterior battery terminals;
    (e) a pair of terminal bushings molded into the primary cover, each adapted to provide electrical connection between an intermediate terminal post and an exterior battery terminal;
    (f) an outer secondary cover adapted to overlie the primary cover and to be attached to the container;
    (g) vent means in the secondary cover in communication with the integral sleeves to provide for the egress of cell gases to atmosphere; and,
    (h) terminal openings in the secondary cover for the exterior battery terminals.

2. A storage battery as defined in claim 1 wherein the exterior battery terminals are offset laterally from the line defined by the intermediate terminal posts.

3. A storage battery as defined in claim 2 including vent sleeves extending downwardly from the underside of the secondary cover and adapted to be inserted into the integral sleeves of the primary cover as the secondary cover is attached to the container.

4. A storage battery as defined in claim 3 including a vent chamber mounting the vent sleeves to the secondary cover and providing a closed passage from the vent sleeves to the vent means.

5. A storage battery as defined in claim 4 wherein the exterior battery terminals comprise a pair of short cable connectors, each having an inner end fused to one intermediate terminal post and terminal bushing, an intermediate cable section extending horizontally through the terminal opening in the secondary cover, and an outer end having a threaded terminal connector.

6. A storage battery as defined in claim 5 wherein each terminal bushing includes a hollow generally cylindrical body portion adapted to receive therein the upper end of the intermediate terminal post as the primary cover is attached to the container.

7. A storage battery as defined in claim 6 wherein each intermediate terminal post includes an axially aligned post extension fused thereto and to the terminal bushing, and the inner end of the cable connector includes a ring end adapted to encircle the post extension and to be fused thereto.

8. A storage battery as defined in claim 4 wherein the exterior battery terminals each comprise an integral extension of a terminal bushing molded therewith into the primary cover.

9. A storage battery as defined in claim 8 wherein each integral terminal bushing and exterior battery terminal comprises:
(a) a hollow generally cylindrical body portion adapted to receive therein and to be fused to the upper end of the intermediate terminal post as the primary cover is attached to the container;
(b) a terminal body portion including a threaded terminal connector having its axis disposed at an acute angle to the vertical container side wall; and,
(c) a horizontally disposed neck interconnecting the cylindrical body portion and the terminal body portion.

10. A storage battery as defined in claim 9 wherein the threaded terminal connector comprises a nut cast into the terminal body portion.

11. A storage battery as defined in claim 10 wherein the outer secondary cover includes terminal surface portions disposed in a plane perpendicular to the axis of the threaded terminal connector, the terminal surface portions including the terminal openings, with the terminal openings disposed to receive the faces of the terminal body portions as the outer secondary cover is attached to the container.

12. A storage battery as defined in claim 8 wherein each integral terminal bushing and exterior battery terminal comprises:
(a) a hollow generally cylindrical body portion adapted to receive therein and to be fused to the upper end of the intermediate terminal post as the primary cover is attached to the container;
(b) a terminal body portion including a vertically projecting top terminal post disposed on the longitudinal centerline of the primary cover; and,
(c) a horizontally disposed neck interconnecting the cylindrical body portion and the terminal body portion.

13. A storage battery as defined in claim 12 wherein the outer secondary cover comprises a horizontally disposed flat outer surface including the terminal openings, with the terminal openings disposed to receive therethrough the projecting top terminal posts as the outer secondary cover is attached to the container.

14. A storage battery as defined in claim 4 wherein the outer secondary cover includes a shroud having wall portions lying parallel to and closely spaced from the container walls and covering the upper portions thereof, and locking means on the inside surfaces of at least two oppositely facing wall portions for engaging the upper edges of the adjacent container walls.

15. A storage battery as defined in claim 14 wherein the container and primary cover are made of polypropylene and the outer secondary cove is made of polyethylene.

16. A storage battery as defined in claim 4 wherein the vent chamber includes a porous gas diffuser adjacent the vent means and baffle means surrounding the vent sleeves for preventing a flow of electrolyte created by condensation or flooding due to tilting the battery from reaching the porous diffuser and the vent means.

17. A storage battery as defined in claim 16 wherein the vent chamber includes a relief valve responsive to excessive pressure in the vent chamber.

* * * * *